United States Patent [19]
Cunningham et al.

[11] Patent Number: 5,399,897
[45] Date of Patent: Mar. 21, 1995

[54] MICROSTRUCTURE AND METHOD OF MAKING SUCH STRUCTURE

[75] Inventors: Brian T. Cunningham, Watertown; Patricia V. Richard, North Billerica, both of Mass.

[73] Assignee: Raytheon Company, Lexington, Mass.

[21] Appl. No.: 158,679

[22] Filed: Nov. 29, 1993

[51] Int. Cl.6 .................. H01L 27/14; H01L 31/00
[52] U.S. Cl. .................. 257/467; 257/469; 257/419
[58] Field of Search .................. 257/467, 469, 419

[56] References Cited

U.S. PATENT DOCUMENTS

| | | | |
|---|---|---|---|
| 3,621,154 | 11/1971 | Kozen | 257/416 |
| 5,058,856 | 10/1991 | Gordon et al. | 257/467 |
| 5,129,983 | 7/1992 | Greiff | 257/419 |
| 5,177,579 | 1/1993 | Jerman | 257/419 |
| 5,193,911 | 3/1993 | Nix et al. | 257/467 |
| 5,298,748 | 3/1994 | Kenny et al. | 257/467 |

Primary Examiner—Andrew J. James
Assistant Examiner—Stephen D. Meier
Attorney, Agent, or Firm—Donald F. Mofford

[57] ABSTRACT

An integrated circuit having a semiconductor layer having formed therein a electronic circuit. An electrical device, electrically connected to the electronic circuit, has a corrugated platform supported over, displaced from, and integrally formed with, the substrate. In a preferred embodiment the electrical device is a bolometer and the electronic circuit is a read out circuit for the device. The platform includes a surface member and a leg, a proximate end of the leg being disposed on the substrate and the distal end being elevated from the substrate and terminating at the surface member. Preferably the leg and the surface member are corrugated. The supporting surface has a corrugation parallel with the leg. The surface member is supported, as a corrugated air-bridge, over the surface of the substrate by corrugated legs. The temperature sensitive resistive material is formed over the corrugated surface member. Electrical conductors are formed over the legs, one end being in contact with the electrical contacts and the other ends being connected to the portions of the temperature sensitive resistive material adjacent the distal ends of the legs.

13 Claims, 4 Drawing Sheets

MICROSTRUCTURE AND METHOD OF MAKING SUCH STRUCTURE

BACKGROUND OF THE INVENTION

This invention relates generally to microstructures and manufacturing methods and more particularly to microbolometers and methods of manufacturing such devices.

As is known in the art, semiconductor manufacturing techniques are being applied to form various microstructures. One such microstructure is a microbolometer used to detect infrared energy. More particularly, an array of such devices is formed integrally with an integrated circuit. The integrated circuit is used to develop electrical signals produced by the microbolometers in .response to the infrared energy impinging on the array thereof. In one such array, each one of the microbolometers includes an infrared energy receiving surface. The surface is made of a material which has its resistivity change as the temperature of the material increases in response to the infrared energy impinging on, and absorbed by, the material. One such material is vanadium oxide. Thus, by placing the material in series with a voltage supply, the current through the material will vary in accordance with the infrared energy sensed by the material. Electronic read circuitry connected to the voltage supply and serially connected temperature sensitive resistive material is used to produce an output signal representative of the infrared energy impinging on the material. The array of bolometers, together with its output electrical signals, and a processor fed by the output electrical signals can thus be used to provide an electronic image of the source of the infrared energy.

As noted above, in some applications, integrated circuit fabrication techniques have been used to form the array of bolometers integrally with the associated electronic read out circuitry. In such application, a substrate, or semiconductor layer, has formed, as integrated circuit, the read out electronics. More particularly, the read out electronics includes an array of read out cells, each one thereof corresponding to one of the bolometers in the array. Each read out cell includes a pair of electrical contacts formed on the upper surface of the semiconductor layer for electrical connection to a corresponding one of the bolometers in the array thereof. Each one of the bolometers includes a thermal insulating, dielectric platform integrally formed over the semiconductor layer. The platform, typically silicon nitride, is formed subsequent to the formation of the array of read out cell. The platform is formed, using conventional integrated circuit photolithography, i.e., sequential photolithographic masking and patterning of layers of material by chemical etching and/or liftoff techniques. Using such techniques, the platform is formed with a pair of legs with proximal ends disposed on the surface at positions adjacent the electrical contacts. The legs are formed so that the distal ends of the legs are elevated over the surface of the substrate. Integrally formed with the legs is a planar square, or rectangular shaped surface member. Opposing corners of the surface member terminate into the distal end of the pair of legs. Thus, the surface member is suspended by the legs, as an air bridging surface, over the surface of the substrate. The temperature sensitive resistive material is formed over the surface member. Electrical conductors are formed over the legs, proximal ends of the conductors being in contact with the electrical contacts and the distal ends being electrically connected to the portions of the temperature sensitive resistive material adjacent the distal ends of the legs. Such arrangement suspends the temperature sensitive resistive material on the elevated, air-bridging surface member from the substrate to thereby increase its thermal isolation from the substrate. The increased thermal isolation thereby increases the sensitivity of the bolometer to the impinging infrared energy. While the suspended, air-bridging, surface member increases the thermal isolation (compared with an arrangement where the temperature sensitive resistive material is in physical contact with the substrate) the temperature sensitive resistive material is not totally isolated because of heat transfer through the legs.

SUMMARY OF THE INVENTION

It is therefore an object of this invention to provide an improved microstructure.

It is another object of the invention to provide a microstructure having a platform with a surface suspended over a supporting substrate by a leg, such structure having improved structural integrity.

It is a further object of the invention to provide an improved method of forming a microstructure.

These and other objects of the invention are attained generally by providing an integrated circuit having a semiconductor layer with an electronic circuit formed therein. An electrical device, electrically connected to the electronic circuit, has a corrugated platform suspended over the substrate. In a preferred embodiment the electrical device is a bolometer and the electronic circuit is a read out circuit for the device. The platform includes a surface member and a leg, a proximate end of the leg being disposed on the substrate and the distal end being elevated from the substrate and terminating at the surface member. Preferably the leg and the surface member are corrugated. The supporting surface has a corrugation parallel with the leg. The surface member is suspended, as a corrugated air-bridging structure over the surface of the substrate by corrugated legs. The temperature sensitive resistive material is formed over the corrugated surface member. Electrical conductors are formed over the legs, proximate ends being in contact with the electrical contacts and distal ends being connected to the portions of the temperature sensitive resistive material adjacent the distal ends of the legs.

With such arrangement, the thermal isolation of the temperature sensitive resistive material from the substrate is increased because thinner, and hence less thermally conductive legs, can be used with additional structural support being provided by the corrugations in the platform.

In accordance with an additional feature of the invention, a method of forming an integrated circuit is provided. The method includes the steps of providing a substrate, or semiconductor layer, with an electronic circuit formed therein, and forming an electrical device electrically connected to the electronic circuit using photolithography (i.e., photolithographic masking—material removal processing), such electrical device being formed with a corrugated platform suspended over the substrate. In a preferred embodiment the electronic device is a bolometer. The platform is formed with a corrugated surface member and a corrugated leg, a proximate end of the leg being disposed on the substrate and the distal end being elevated from the substrate and terminating at the surface member. The supporting surface is formed with a corrugation parallel with the leg.

In a preferred embodiment, the method comprises the steps of: providing a substrate; forming a corrugation forming member on a first portion of the surface of the substrate; depositing a first layer of material over the corrugation forming member and over adjacent surface portions of the substrate, a portion of an upper surface the first layer of material deposited over the corrugation forming member being elevated from a portion of the upper surface of the first layer deposited over the adjacent surface portions of the substrate; removing a portion of the first layer of material exposing a second surface portion of the substrate; forming a portion of the first layer with a sloped surface extending from the exposed portion of the substrate to the upper surface of the first material; depositing a second layer of material over the upper surface of the first layer of material, such second layer of material being deposited over the corrugation forming member, over the adjacent surface portions of the substrate, and over the sloped surface portion of the first layer of material, a portion of an upper surface the second layer of material deposited over the corrugation forming member being elevated from a portion of the upper surface of the second layer deposited over the adjacent surface portions of the substrate, and a portion of the second layer of material sloping upwardly from the exposed portion of the substrate; patterning the second layer of material into a corrugated platform, such platform having portions thereof disposed over the corrugating forming member, over the adjacent surface portions of the substrate, and over the sloped surface portion of the first layer of material; and, removing the first layer of material to form the corrugated platform with a surface member suspended over the substrate by a leg having a proximal end disposed on the exposed surface portion of the substrate, a distal end elevated from the substrate to suspend the surface member., and a sloped portion between the distal end and the proximate end.

BRIEF DESCRIPTION OF THE DRAWING

For a more complete understanding of the concepts of the invention reference is now made to the following drawings, in which.

DESCRIPTION OF THE PREFERRED EMBODIMENTS

Figure 1:
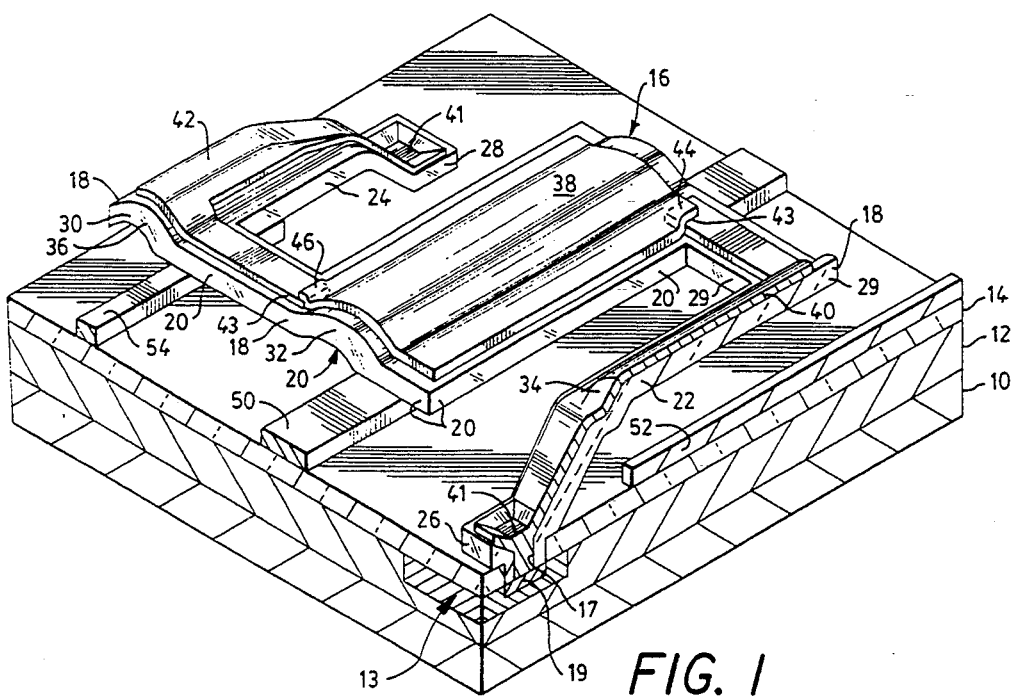
FIG. 1 is an isometric, diagrammatical drawing of a microbolometer according to the invention.

Referring now to FIG. 1, a substrate 10, here silicon, is shown, having a semiconductor layer 12, here silicon, with an electronic circuit 13, formed therein as a conventional integrated circuit, and an insulating layer 14 formed thereon. An electrical device 16, here a bolometer, is electrically connected to the electrical contacts 19 of the electronic circuit 13, here a conventional read out circuit for the bolometer device 16. The upper surfaces of the electrical contacts 19 are exposed by vias formed in the insulating layer 14. The electrical device 16, has a corrugated dielectric, thermal insulating platform 18, here a 0.5 micrometer thick layer of silicon nitride, integrally formed with, the substrate 10. The platform 18 includes a surface member 20 and a pair of legs 22, 24. The proximate ends 26, 28, of the legs 22, 24, respectively, are disposed on the upper surface of the substrate 10 and the distal ends 29, 30, respectively, are elevated from the upper surface of the substrate 10 and terminate at the surface member 20, as shown. Preferably the legs 22, 24 and the surface member 20 are both corrugated, as shown. The supporting surface 20 has a corrugation 32 parallel with the corrugations 34, 36 of legs 22, 24, respectively, as shown. The surface member 20 is, thus, suspended at distal ends 29, 30 of corrugated legs 22, 24, over the upper surface of the substrate 10 as an air bridge. A temperature sensitive resistive material 38, here vanadium oxide, is formed over the corrugated, suspended surface member 20, as shown. Electrical conductors 40, 42, here, successively formed layers of titanium and aluminum, are formed over the legs 22, 24, as shown. The proximal end 41 of each of the conductors 40, 42 is in electrical contact with electrical contact 19 of the electronic circuit 13 formed in the semiconductor layer 12, and the distal end 43 of each of the conductors 40, 42 is electrically connected to the opposite corner portions 44, 46 of the temperature sensitive resistive material 38, as shown. Also shown in FIG. 1 are three corrugation forming members 50, 52 and 54. These corrugation forming members 52, 54, and 50 are used, as will be described in connection with FIGS. 2A-2F, to form the corrugations in legs 22, 24 and surface member 20, respectively.

With such arrangement, while the thermal isolation of the temperature sensitive resistive material suspended over the substrate is increased because thinner, and hence less thermally conductive legs can be used with additional structural support being provided by the corrugations in the surface member 20 and legs 22, 24.

Figure 2A:
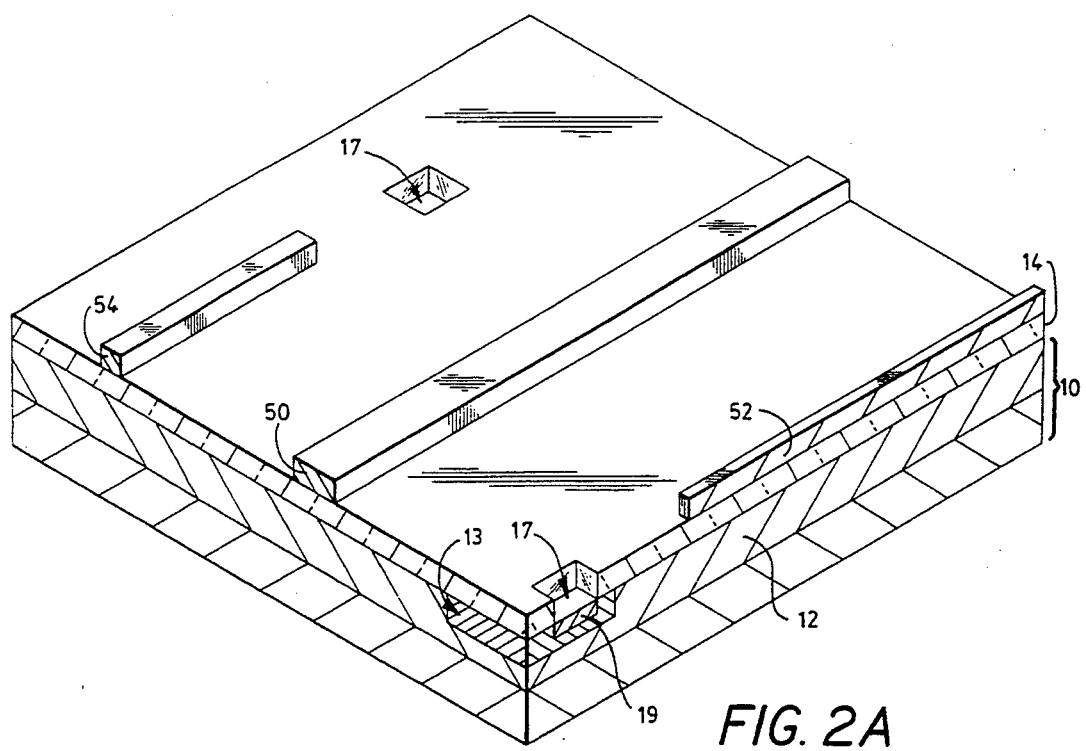
FIGS. 2A-2F are isometric diagrammatical sketches of the microbolometer of FIG. 1 at various stages in the fabrication thereof.

Referring now to FIG. 2A, the substrate 10 is shown having the semiconductor layer 12 with the electronic circuit 13, formed therein using conventional integrated circuit fabrication processing. The insulating layer 14, here a 0.5 micrometer thick layer of silicon dioxide, is deposited over the surface of the substrate 10 and patterned, in a conventional manner, to have the pair of vias 17 formed therein to expose the electrical contacts 19 of the electronic read out circuit 13, formed in the semiconductor layer 12, as shown. Next, a thin layer of titanium, here 500 Angstroms thick, followed by layer, here a 0.5 micrometer thick layer of aluminum, is deposited over the surface of the substrate 10 and patterned using conventional photolithographic—liftoff techniques to form the three corrugation forming members 50, 52 and 54, as shown. It is noted that corrugation forming members 50, 52 do not extend over the vias 17.

Figure 2B:
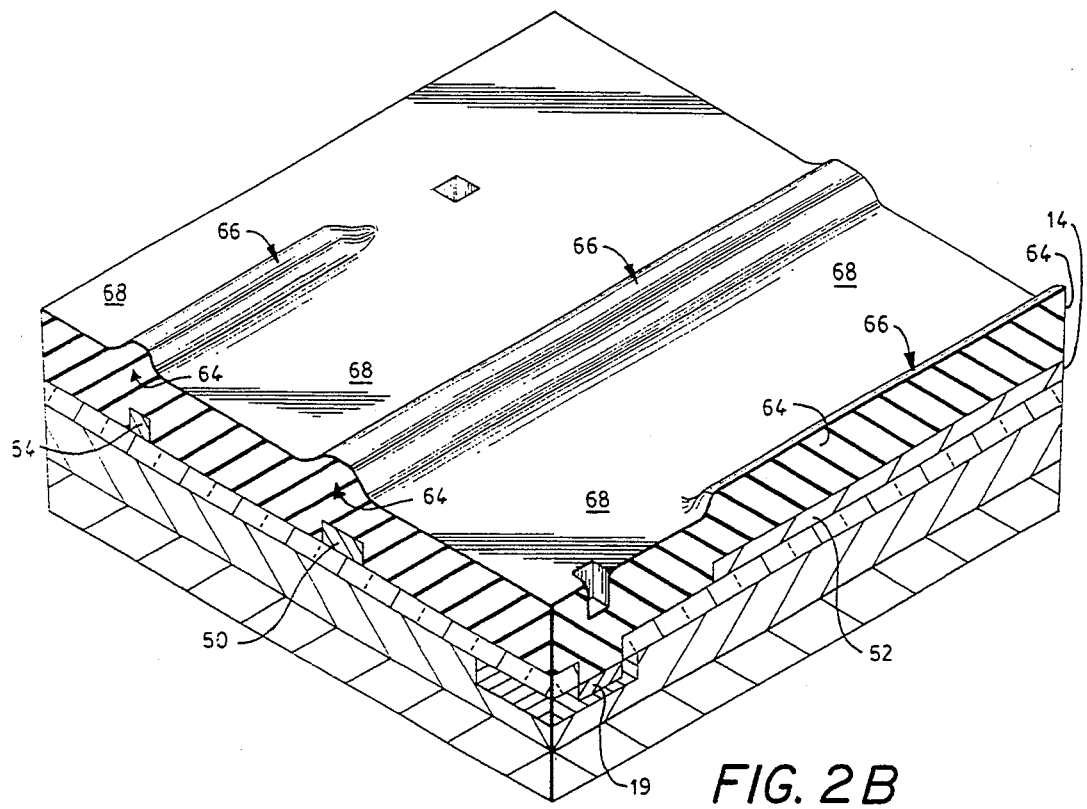
Figure 2C:
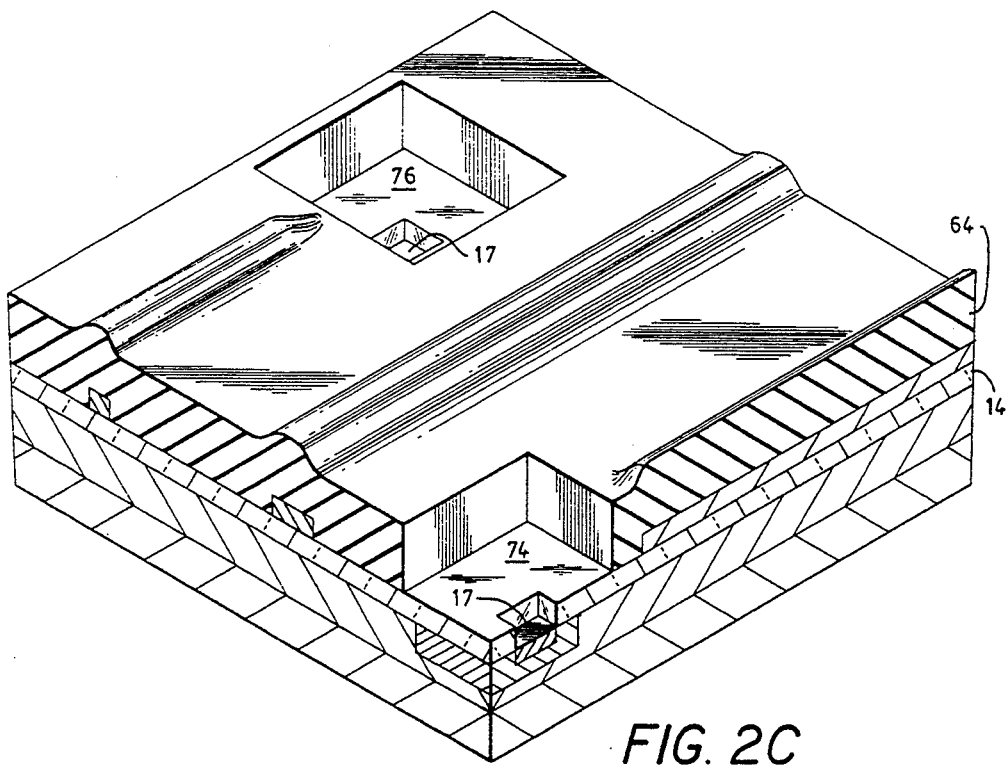

Referring now to FIG. 2B, a layer 64 of material, here polydimethyl glutarmide (PMGI) is deposited, here spun, over the surface of the structure, as shown, in a conventional manner. Here, the PMGI layer 64 is deposited to a thickness of 1.5 micrometers. It is noted that the PMGI layer 64 is deposited over the corrugation forming members 50, 52 and 54 and over adjacent surface portions of the substrate 10, more particularly over the adjacent surface portions of the silicon dioxide layer 14. Thus, the portions 66 of an upper surface the PMGI layer 64 deposited over the corrugation forming members 50, 52 and 54 are elevated from the adjacent upper surface portion 68 of the PMGI layer 64, as shown.

Figure 2D:
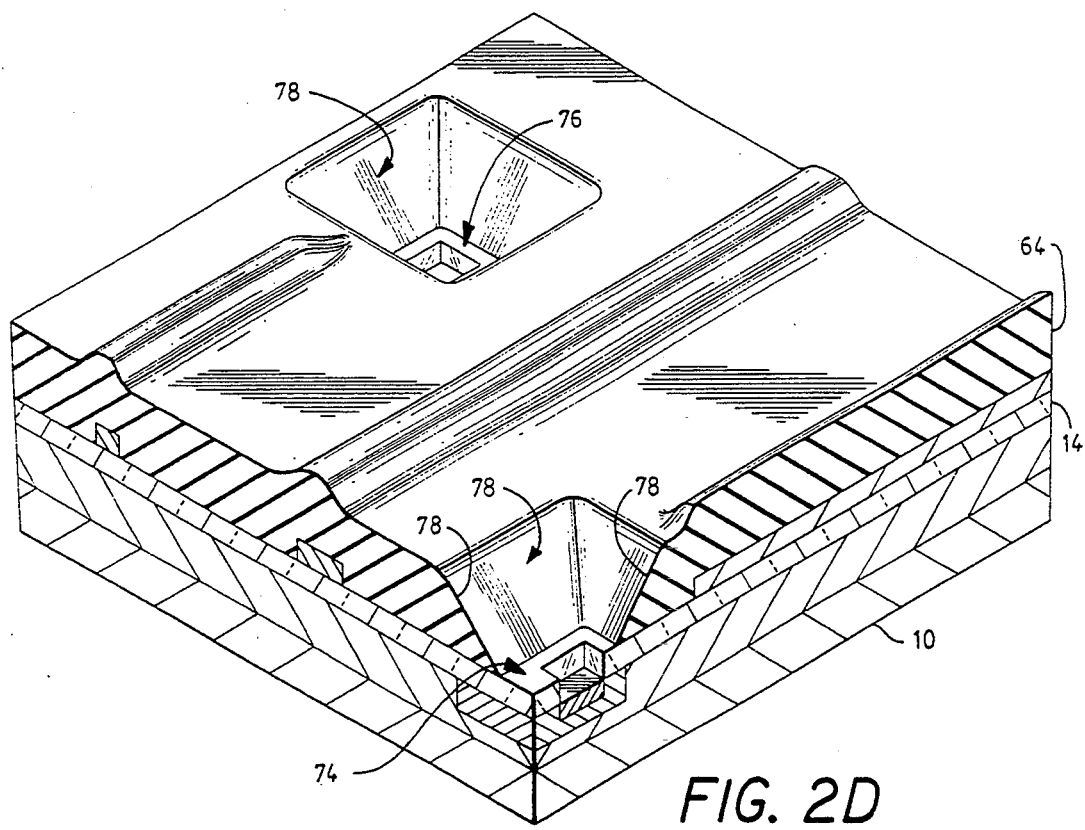

Referring now to FIG. 2D, portions of the PMGI layer 64 adjacent the vias 17 (FIG. 2C) are selectively removed or patterned using conventional photolithography, here photolithographic—chemical etching techniques to expose surface portions 74, 76 of the substrate 10, more particularly, of the silicon dioxide layer 14, as shown.

Referring now to FIG. 2D, the structure is baked in air at a temperature of 250 degrees Centigrade for 20 seconds to cause the PMGI material to melt and reflow and thereby round the corners thereof near the exposed surface portions 74, 76, as shown. Thus, the heating, or baking process, forms a portion of the PMGI layer 64 with a sloped surfaces 78 extending from the exposed portions 74, 76 of the substrate 10 to the upper, non-sloped surface portions of the PMGI layer 64, as shown.

Figure 2E:
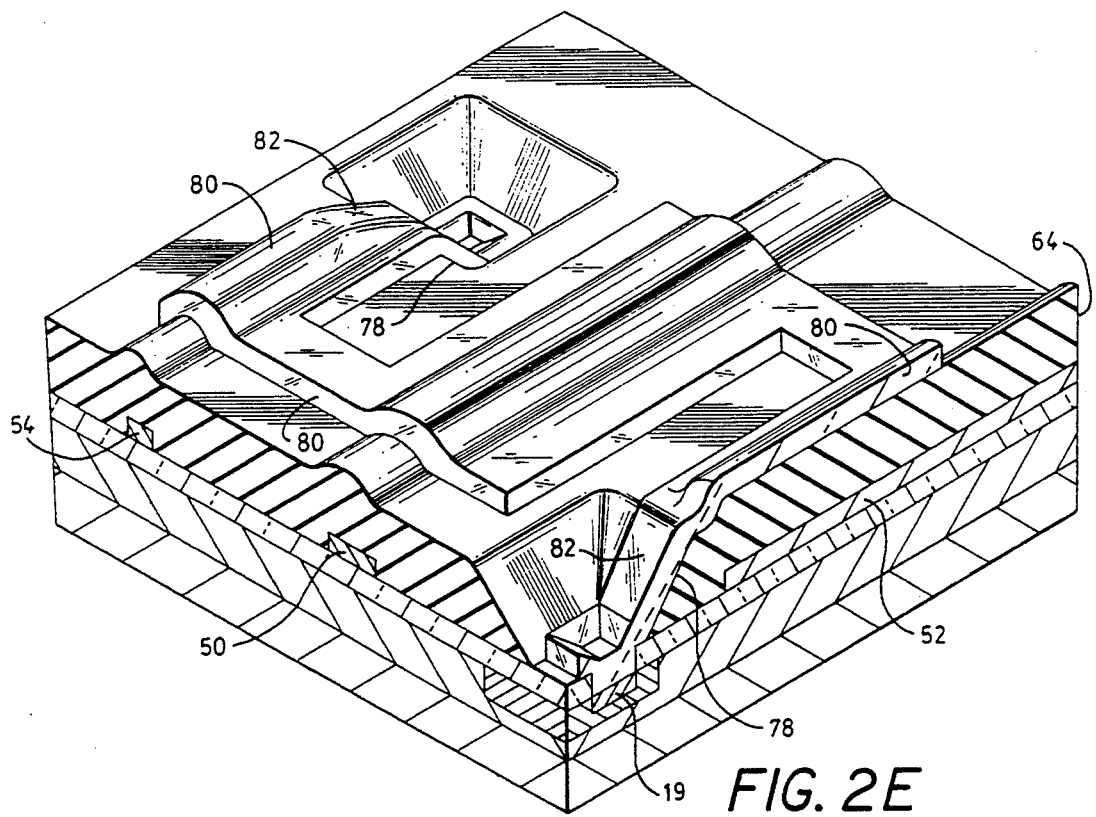

Referring now to FIG. 2E, a layer 80 of dielectric, thermally insulating material, here a 0.5 micrometer thick layer of silicon nitride, is patterned over the upper surface of the PMGI layer 64 using conventional photolithography, here photolithographic—liftoff techniques. It is noted that the layer 80 is disposed over the corrugation forming members 50, 52 and 54, over the adjacent surface portions of the substrate 10, and over the sloped surfaces 78 of the PMGI layer 64, as shown. It is also noted that the portions of an upper surface the insulating layer 80 disposed over the corrugation forming members 50, 52 and 54 are elevated from the portion of the upper surface of the insulating layer 80 disposed over the adjacent surface portions of the substrate 10. It is still further noted that portions 82 of the insulating layer 80 over the sloped portions 78 of the PMGI layer 64 correspondingly sloping upwardly from the previously exposed surface portions 74, 76 (FIG. 2D) of the substrate 10. Thus, the insulating layer 80 is patterned into the corrugated platform 18 (FIG. 1). The platform 18 has portions thereof disposed over the corrugating forming members 50, 52, and 54, over the adjacent surface portions of the substrate 10, and over the sloped surface portions 78 of the PMGI layer 64, as shown.

Figure 2F:
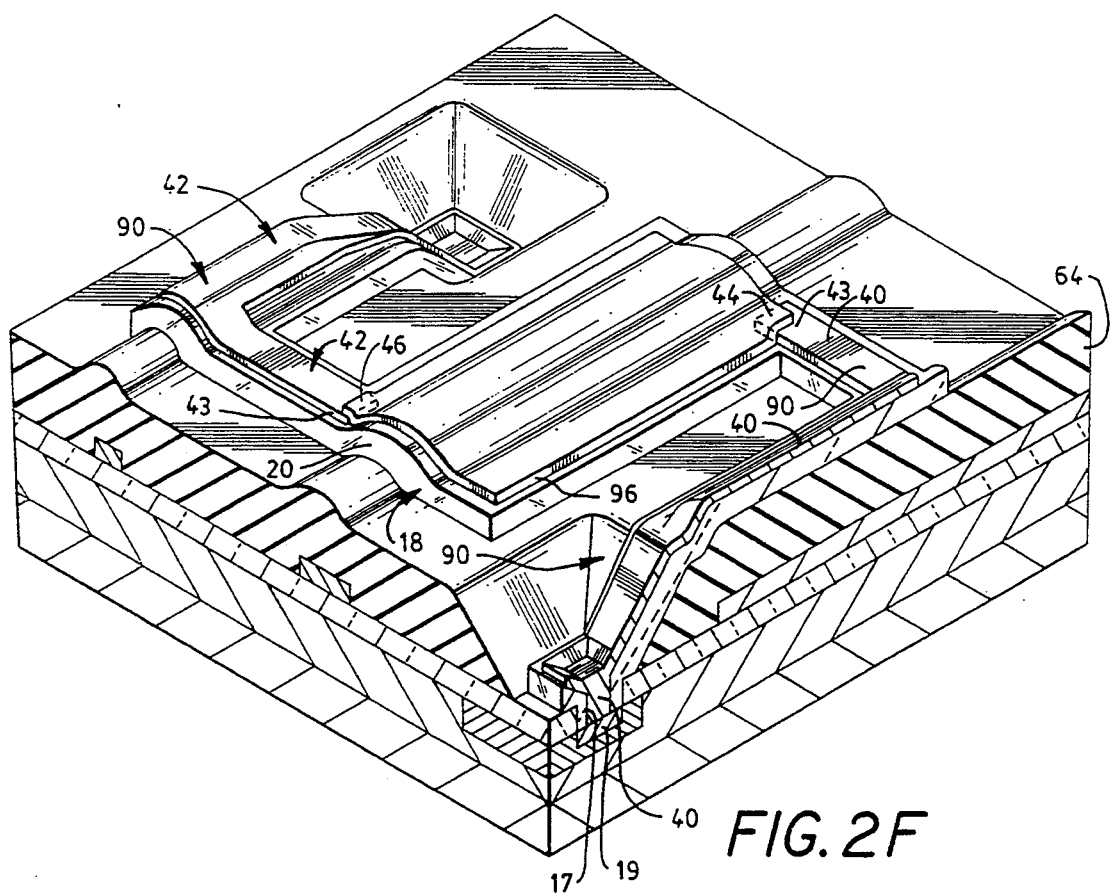

Referring now to FIG. 2F, after removing the portions of the silicon dioxide layer 14 in vias 17 by a conventional photolithographic reactive ion etching techniques, a metallization layer 90 is patterned on the insulating layer 80 using conventional photolithography, here photolithographic—liftoff techniques, to form the electrical conductors 40, 42, as shown. Next, a layer 96 of vanadium is patterned on the surface of the platform 18 (more specifically surface member 20) using conventional photolithography, here photolithographic—liftoff techniques. It is noted that the opposing edge portions of layer 96 are disposed on the distal portions of the electrical conductors 40, 42, as shown. It is noted that portions of layer 96 are formed over the corrugated surface member 20, as shown. Likewise, it is also noted that the electrical conductors 40, 42 are formed over the corrugated legs 22, 24, as shown. As shown, the proximal end of each of the conductors 40, 42 is in electrical contact with electrical contacts 19 of the electronic circuit formed in the semiconductor layer 12, and the distal end 43 of each of the conductors 40, 42 are in contact with the opposite corner portions 44, 46 of the vanadium layer 96, as shown.

Next, the PMGI layer 64 is removed, as shown, here using N-methyl pyrrolidone (NMP), to produce the structure shown in FIG. 1. The structure is then placed in an oxygenating atmosphere to convert the vanadium layer 96 into vanadium oxide, i.e., the temperature sensitive resistive material 38. The distal end 43 of each of the conductors 40, 42 are now in electrical contact with the opposite corner portions 44, 46 of the vanadium oxide, temperature sensitive material 38. Removing the PMGI layer 64 forms the corrugated platform 18 (FIG. 1) with a corrugated surface member 20 suspended over the upper surface of substrate 10 at the distal ends 29, 30 of the pair of corrugated leg 22, 24. The proximate ends 26, 28 of legs 22, 24 are disposed on the exposed surface portion of the substrate 10. The distal ends 29, 30 are elevated from the upper surface of the substrate 10, with sloped portions of the legs 22, 24 being disposed between the distal ends 29, 30 and the proximate ends 26, 28.

Having described a preferred embodiment of the invention it will now be apparent to one of skill in the art that other embodiments incorporating its concepts may be used. For example, while corrugations have been shown in both legs as well as in the surface member, adequate improvement in the structural support may be achieved using corrugation in just the legs, or in just the surface member. Further, while a microbolometer has been described, corrugations may be used in other microstructure devices. It is felt therefore, that the scope of the invention should not be limited to the disclosed embodiment but, rather should be limited only by the spirit and scope of the appended claims.

What is claimed is:

1. A integrated circuit, comprising:
   a) a semiconductor layer;
   b) a electronic circuit formed in the semiconductor layer;
   c) an electrical device electrically connected to the electronic circuit, such electrical device having a corrugated platform with a surface member suspended over the semiconductor layer; and
   d) wherein such surface member has a supported edge portion and an unsupported edge portion.

2. The integrated circuit recited in claim 1 wherein the platform has a leg, a proximate end of the leg being disposed on the semiconductor layer and a distal end being elevated from the semiconductor layer and terminating at the supported edge portion of the surface member to support the surface member over the semiconductor layer.

3. The integrated circuit recited in claim 2 wherein the leg is corrugated.

4. The integrated circuit recited in claim 2 wherein the surface member is corrugated.

5. The integrated circuit recited in claim 2 wherein the surface member has a corrugation formed therein, and wherein such leg has a portion which rises from the semiconductor layer to an elevated region along a predetermined direction, such corrugation being parallel with the predetermined direction.

6. The integrated circuit recited in claim 3 wherein the leg and the surface member are corrugated.

7. The integrated circuit recited in claim 1 wherein the electronic device is a bolometer.

8. A structure, comprising:
   a) a substrate having a semiconductor layer;
   b) a corrugated platform having a surface member suspended over the substrate and the semiconductor layer, the surface member having a supported edge portion and an unsupported edge portion.

9. The structure recited in claim 8 wherein the platform has a leg, a proximate end of the leg being disposed on the substrate and a distal end being elevated from the substrate and terminating at the supported edge portion of the surface member to support the platform over the semiconductor layer.

10. The structure recited in claim 9 wherein the leg is corrugated.

11. The structure recited in claim 9 wherein the surface member is corrugated.

12. The structure circuit recited in claim 9 wherein the surface member has a corrugation formed therein, and wherein such leg has a portion which rises from the semiconductor layer to an elevated region along a predetermined direction, such corrugation being parallel with the predetermined direction.

13. The structure recited in claim 10 wherein the leg and the surface member are corrugated.

* * * * *